(12) United States Patent
Daimon

(10) Patent No.: US 11,133,790 B2
(45) Date of Patent: Sep. 28, 2021

(54) ACOUSTIC WAVE DEVICE

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/807,306

(22) Filed: Mar. 3, 2020

(65) Prior Publication Data

US 2020/0204154 A1 Jun. 25, 2020

Related U.S. Application Data

(63) Continuation of application No. PCT/JP2018/032884, filed on Sep. 5, 2018.

(30) Foreign Application Priority Data

Sep. 7, 2017 (JP) .............................. JP2017-171718

(51) Int. Cl.
  *H03H 9/145* (2006.01)
  *H03H 9/02* (2006.01)
  (Continued)

(52) U.S. Cl.
  CPC .... *H03H 9/14541* (2013.01); *H03H 9/02228* (2013.01); *H03H 9/02574* (2013.01);
  (Continued)

(58) Field of Classification Search
  CPC ........... H03H 9/14541; H03H 9/02228; H03H 9/02574; H03H 9/02866; H03H 9/02992;
  (Continued)

(56) References Cited

U.S. PATENT DOCUMENTS

2013/0051588 A1   2/2013   Ruile et al.
2013/0249647 A1   9/2013   Nakanishi et al.
                         (Continued)

FOREIGN PATENT DOCUMENTS

JP   2009-159039 A   7/2009
JP   2014-131351 A   7/2014
                    (Continued)

OTHER PUBLICATIONS

Official Communication issued in International Patent Application No. PCT/JP2018/032884, dated Oct. 23, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a piezoelectric substrate with a reverse-velocity surface having an ellipse shape, an IDT electrode on the piezoelectric substrate, and a dielectric film on the piezoelectric substrate and covering the IDT electrode. The acoustic wave device utilizes a Love wave. The IDT electrode includes an intersecting region in which first electrode fingers and second electrode fingers are interdigitated. The intersecting region includes a central region, a first edge region and a second edge region located at both ends of the central region. When x (%) denotes a wavelength-normalized film thickness of the IDT electrode and y (g/cm$^3$) denotes an electrode density of the IDT electrode, the wavelength-normalized film x is set at a value not less than x that satisfies Equation 1. The film thicknesses of the dielectric films in the first and second edge regions are smaller than the dielectric film in the central region.

20 Claims, 7 Drawing Sheets

(51) Int. Cl.
*H03H 9/13* (2006.01)
*H03H 9/17* (2006.01)

(52) U.S. Cl.
CPC .... *H03H 9/02866* (2013.01); *H03H 9/02992* (2013.01); *H03H 9/131* (2013.01); *H03H 9/17* (2013.01)

(58) Field of Classification Search
CPC ...... H03H 9/131; H03H 9/17; H03H 9/02858; H03H 9/02881; H03H 9/145; H03H 9/25
USPC .......................................... 333/133, 193–196
See application file for complete search history.

(56) References Cited

U.S. PATENT DOCUMENTS

| | | | |
|---|---|---|---|
| 2016/0126928 A1* | 5/2016 | Ruile | ................ H03H 9/02535 310/313 B |
| 2016/0211829 A1 | 7/2016 | Iwaki et al. | |
| 2017/0170808 A1 | 6/2017 | Iwaki et al. | |
| 2019/0158059 A1* | 5/2019 | Taniguchi | .......... H03H 9/02637 |

FOREIGN PATENT DOCUMENTS

| | | | |
|---|---|---|---|
| JP | 2015-111923 A | 6/2015 |
| JP | 2016-136712 A | 7/2016 |
| JP | 2017-112603 A | 6/2017 |

\* cited by examiner

ACOUSTIC WAVE DEVICE

CROSS REFERENCE TO RELATED APPLICATIONS

This application claims the benefit of priority to Japanese Patent Application No. 2017-171718 filed on Sep. 7, 2017 and is a Continuation Application of PCT Application No. PCT/JP2018/032884 filed on Sep. 5, 2018. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used for filters of mobile phones. Japanese Unexamined Patent Application Publication No. 2015-111923 describes an example of an acoustic wave device that utilizes a Rayleigh wave. In this acoustic wave device, a transverse-mode ripple is significantly reduced or prevented by decreasing the acoustic velocity in edge regions. More specifically, first electrode fingers and second electrode fingers overlap each other as viewed in the propagation direction of acoustic wave. Edge regions are formed in the overlapping region near both ends thereof in the extending direction of the electrode fingers. The film thicknesses of dielectric films in the edge regions are larger than the film thickness of a dielectric film in a central region located between both edge regions. The acoustic velocity in the edge regions are thereby lowered.

It has been considered in the related art that the acoustic velocity can be lowered by increasing mass added to the IDT electrode by way of, for example, increasing the thickness of the dielectric film laminated on the IDT electrode.

On the contrary, however, the inventor of preferred embodiments of the present invention has discovered that in the case of an acoustic wave device utilizing a Love wave, increasing the thicknesses of the dielectric films in the edge regions causes the acoustic velocity to increase. If the acoustic velocity in the edge region becomes higher than that in the central region, a transverse-mode ripple cannot be reduced or prevented.

SUMMARY OF THE INVENTION

Preferred embodiments of the present invention provide acoustic wave devices that each utilize a Love wave and in each of which the acoustic velocities in the edge regions can be lowered reliably and a transverse-mode ripple is thereby significantly reduced or prevented.

According to a preferred embodiment of the present invention, an acoustic wave device includes a piezoelectric substrate including a piezoelectric layer with a reverse-velocity surface having an ellipse shape, an IDT electrode provided on the piezoelectric substrate, and a dielectric film provided on the piezoelectric substrate and covering the IDT electrode. The acoustic wave device utilizes a Love wave. The IDT electrode includes a first busbar and a second busbar that are positioned opposite to each other, first electrode fingers of which respective first ends are connected to the first busbar, and second electrode fingers of which respective first ends are connected to the second busbar and that are interdigitated with the first electrode fingers. When a first direction denotes a propagation direction of an acoustic wave and a second direction denotes a direction orthogonally or substantially orthogonally intersecting the first direction, the IDT electrode further includes an intersecting region in which the first electrode fingers and the second electrode fingers overlap each other as viewed in the first direction. The intersecting region includes a central region located at a central portion of the intersecting region in the second direction, a first edge region adjacent to or in a vicinity of the central region at a position near the first busbar, and a second edge region adjacent to or in a vicinity of the central region at a position near the second busbar. When $\lambda$ denotes a wavelength defined by a pitch of electrode fingers of the IDT electrode, h denotes a film thickness of the IDT electrode, x (%) denotes a wavelength-normalized film thickness defined as $h/\lambda \times 100(\%)$, and y (g/cm$^3$) denotes an electrode density of the IDT electrode, the wavelength-normalized film thickness x is set, depending on the electrode density y of the IDT electrode, at a value not less than x that satisfies $$y = 0.0757x^2 - 3.9023x + 27.986 \qquad \text{(Equation 1).}$$

In addition, a film thickness of the dielectric film in the first edge region and a film thickness of the dielectric film in the second edge region are smaller than that of the dielectric film in the central region.

According to another preferred embodiment of the present invention, an acoustic wave device includes a piezoelectric substrate including a piezoelectric layer with a reverse-velocity surface having an ellipse shape, an IDT electrode provided on the piezoelectric substrate, and a dielectric film provided on the piezoelectric substrate and covering the IDT electrode. The acoustic wave device utilizes a Love wave. The IDT electrode includes a first busbar and a second busbar that are positioned opposite to each other, first electrode fingers of which respective first ends are connected to the first busbar, and second electrode fingers of which respective first ends are connected to the second busbar and that are interdigitated with the first electrode fingers. When a first direction denotes a propagation direction of an acoustic wave and a second direction denotes a direction orthogonally or substantially orthogonally intersecting the first direction, the IDT electrode further includes an intersecting region in which the first electrode fingers and the second electrode fingers overlap each other as viewed in the first direction. The intersecting region includes a central region located at a central portion of the intersecting region in the second direction, a first edge region adjacent to or in a vicinity of the central region at a position near the first busbar, and a second edge region adjacent to or in a vicinity of the central region at a position near the second busbar. The IDT electrode is made of Pt, Au, W, Ta, Mo, or Cu. When $\lambda$ denotes a wavelength defined by a pitch of electrode fingers of the IDT electrode, h denotes a film thickness of the IDT electrode, x (%) denotes a wavelength-normalized film thickness defined as $h/\lambda \times 100(\%)$, the wavelength-normalized film thickness x is set, depending on a material of the IDT electrode, at a value not less than a corresponding value in Table 1 below. In addition, a film thickness of the dielectric film in the first edge region and a film thickness of the dielectric film in the second edge region are smaller than that of the dielectric film in the central region. Accordingly, even in the case of the IDT electrode being thick, the acoustic velocities in the edge regions can be lowered even more reliably.

TABLE 1

| Material | x = h/λ × 100 (%) |
| --- | --- |
| Pt | ≥1.8 |
| W | ≥2.2 |
| Mo | ≥5.05 |
| Ta | ≥2.55 |
| Au | ≥1.9 |
| Cu | ≥5.25 |

With the acoustic wave devices according to preferred embodiments of the present invention, the acoustic velocity in the edge regions can be lowered reliably and thereby a transverse-mode ripple can be significantly reduced or prevented in the case of the acoustic wave device utilizing a Love wave.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing preferred embodiments of the present invention with reference to the drawings.

Note that the preferred embodiments described herein are examples, and features can be partially replaced or combined with each other between different preferred embodiments.

Figure 1:
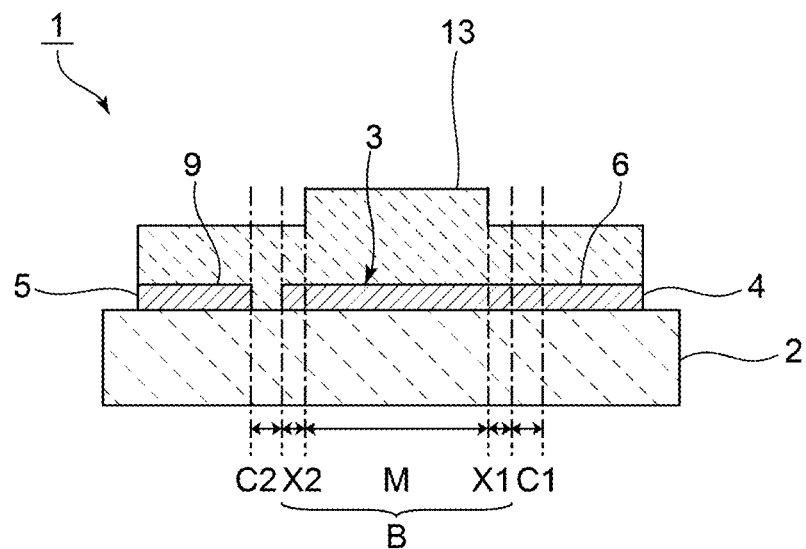
FIG. 1 is a cross-sectional view showing an acoustic wave device according to a first preferred embodiment of the present invention.
Figure 2:
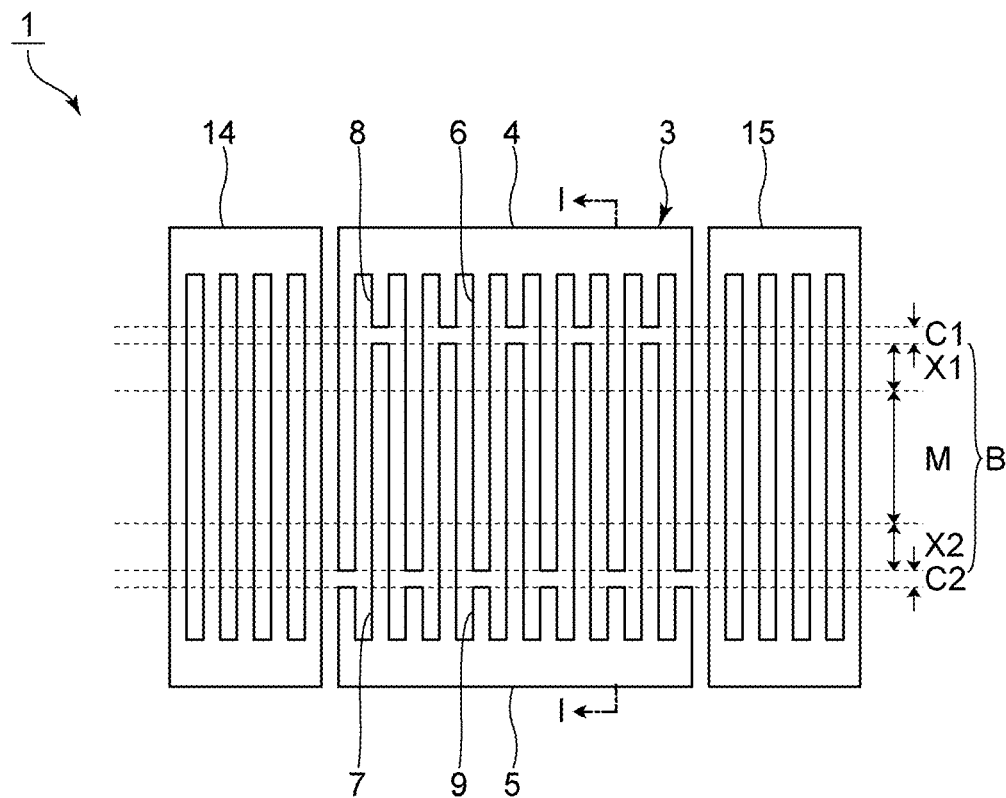
FIG. 2 is a plan view showing an electrode of the acoustic wave device according to the first preferred embodiment of the present invention.

FIG. 1 is a cross-sectional view showing an acoustic wave device according to a first preferred embodiment of the present invention. FIG. 2 is a plan view showing an electrode of the acoustic wave device according to the first preferred embodiment. FIG. 1 is a cross section taken along line I-I in FIG. 2. Note that a later-described dielectric film is omitted in FIG. 2.

As shown in FIG. 1, an acoustic wave device 1 includes a piezoelectric substrate 2. The piezoelectric substrate 2 includes a piezoelectric layer that includes a reverse-velocity surface having an ellipse shape. In the first preferred embodiment, the piezoelectric layer of the piezoelectric substrate 2 is preferably made of, for example, $LiNbO_3$. Note that the piezoelectric substrate 2 of the acoustic wave device 1 is a piezoelectric substrate including only the piezoelectric layer. However, the piezoelectric substrate 2 may be a multilayer substrate that includes the piezoelectric layer.

As shown in FIG. 2, an IDT electrode 3 is provided on the piezoelectric substrate 2. An acoustic wave is excited by applying an alternating voltage to the IDT electrode 3. A Love wave is excited as an acoustic wave. Note that in the first preferred embodiment, the Euler angle ($\varphi$, $\theta$, $\psi$) of the piezoelectric substrate 2 is not specifically limited but may preferably be, for example, an Euler angle of ($\varphi$, a range of −90°±30°, $\psi$). Preferably, a Love wave is excited, for example. Note that the range of $\theta$ of the Euler angle described above includes the upper limit and the lower limit of the value specified using the ± sign.

Here, a first direction denotes a propagation direction of acoustic wave, and a second direction denotes a direction orthogonally or substantially orthogonally intersecting the propagation direction of acoustic wave. A reflector 14 and a reflector 15 are provided in respective side regions adjacent to or in a vicinity of the IDT electrode 3 in the first direction of the IDT electrode 3. A one-port surface acoustic wave resonator is thus structured.

The IDT electrode 3 includes a first busbar 4 and a second busbar 5 that are provided at positions opposite to each other. Respective first ends of first electrode fingers 6 are connected to the first busbar 4. Respective first ends of second electrode fingers 7 are connected to the second busbar 5. The first electrode fingers 6 and the second electrode fingers 7 are interdigitated with each other. The first electrode fingers 6 and the second electrode fingers 7 extend parallel or substantially parallel to each other in the second direction.

The IDT electrode 3 includes an intersecting region B in which the first electrode fingers 6 and the second electrode fingers 7 overlap each other as viewed in the first direction. The intersecting region B includes a central region M located at a central portion in the second direction and a first edge region X1 and a second edge region X2 that are respective side regions adjacent to or in a vicinity of the central region M in the second direction. The first edge region X1 is adjacent to or in a vicinity of the central region M at a position near the first busbar 4. The second edge region X2 is adjacent to or in a vicinity of the central region M at a position near the second busbar 5.

The IDT electrode 3 further includes a first gap region C1 adjacent to or in a vicinity of the first edge region X1 at a position near the first busbar 4 and also includes a second gap region C2 adjacent to or in a vicinity of the second edge region X2 at a position near the second busbar 5. Of the first and second electrode fingers 6 and 7, only the first electrode fingers 6 are provided in the first gap region C1. Of the first and second electrode fingers 6 and 7, only the second electrode fingers 7 are provided in the second gap region C2.

In the first preferred embodiment, the IDT electrode 3 further includes first dummy electrode fingers 8 of which respective first ends are connected to the first busbar 4 and second dummy electrode fingers 9 of which respective first ends are connected to the second busbar 5. The first dummy electrode fingers 8 oppose corresponding second electrode fingers 7 with the first gap region C1 interposed therebetween. The second dummy electrode fingers 9 oppose corresponding first electrode fingers 6 with the second gap region C2 interposed therebetween.

As shown in FIG. 1, a dielectric film 13 is provided on the piezoelectric substrate 2 and covers the IDT electrode 3. In the first preferred embodiment, the dielectric film 13 is preferably made of, for example, $SiO_2$. Note that the material of the dielectric film 13 is not limited to $SiO_2$ but may be another silicon oxide $SiO_x$, in which "x" is an integer other than 2. Alternatively, the material of the dielectric film 13 may be another dielectric material, for example, SiON.

It has been considered in the related art that as the thickness of the dielectric film laminated on the IDT electrode increases, the acoustic velocity decreases due to a mass addition effect. On the contrary, as described above, the inventor of preferred embodiments of the present invention has discovered that in the case in which a Love wave is excited and the thickness of the electrode is a certain value or more, the acoustic velocity increases as the thickness of the dielectric film increases.

Here, where λ denotes a wavelength defined by the pitch of electrode fingers of the IDT electrode 3, h denotes the film thickness of the IDT electrode 3, x (%) denotes the wavelength-normalized film thickness of the IDT electrode 3 defined as $h/λ \times 100(\%)$, and y ($g/cm^3$) denotes the electrode density of the IDT electrode 3. The first preferred embodiment is characterized as follows: 1) A Love wave is excited; 2) With respect to the electrode density y of the IDT electrode 3, the wavelength-normalized film thickness x of the IDT electrode 3 is set at a value not less than x that satisfies the following equation:

$$y=0.0757x^2-3.9023x+27.986 \quad \text{(Equation 1)};$$

and 3) The film thickness of the dielectric film 13 in the first edge region X1 and the film thickness of the dielectric film 13 in the second edge region X2 are smaller than that of the dielectric film 13 in the central region M. Accordingly, the acoustic velocities of the acoustic waves in the first and second edge regions X1 and X2 can be lowered compared with the acoustic velocity in the central region M even in the case in which the Love wave is excited and the film thickness of the IDT electrode 3 is large. These points are described more specifically below.

Figure 3:
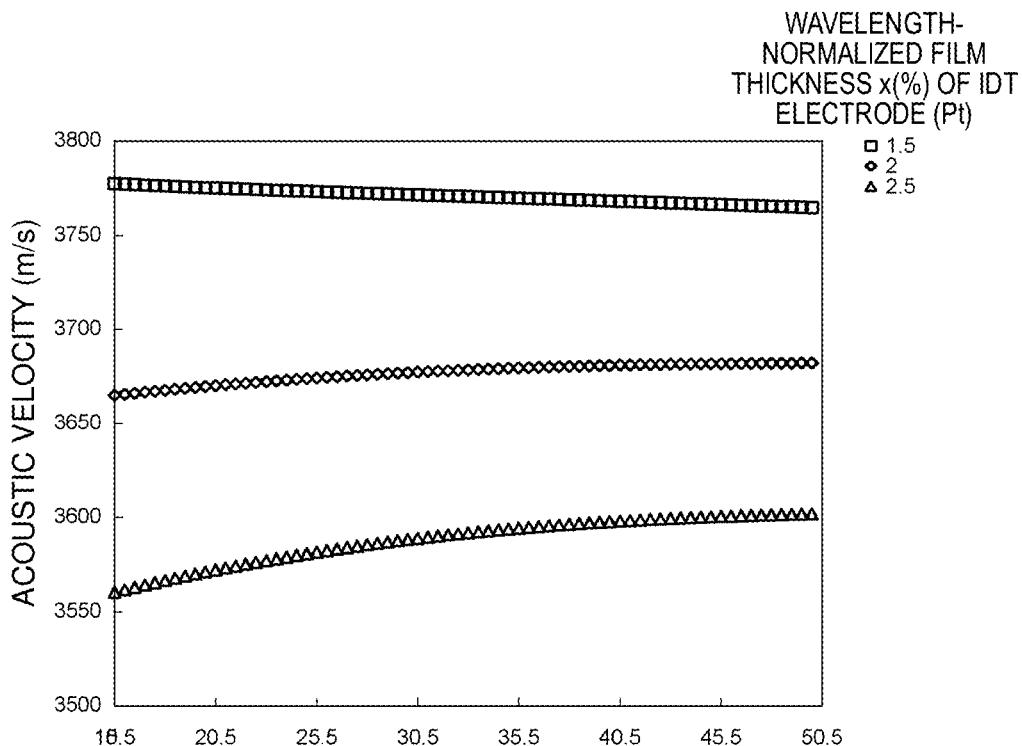
FIG. 3 is a view showing a relationship of a wavelength-normalized film thickness of a dielectric film, an acoustic velocity of an acoustic wave, and a wavelength-normalized film thickness of an IDT electrode in a case of the IDT electrode including Pt.

FIG. 3 is a view showing a relationship of the wavelength-normalized film thickness of the dielectric film, the acoustic velocity of the acoustic wave, and the wavelength-normalized film thickness of the IDT electrode in a case of the IDT electrode being made of Pt. The dielectric film used here was made of $SiO_2$.

As is apparent from FIG. 3, in the case of the IDT electrode being made of Pt, when the wavelength-normalized film thickness of the IDT electrode is less than about 1.8%, the acoustic velocity decreases as the wavelength-normalized film thickness of the dielectric film increases. However, when the wavelength-normalized film thickness of the IDT electrode is about 1.8% or more, the acoustic velocity increases as the wavelength-normalized film thickness of the dielectric film increases.

In the case of the IDT electrode being made of a metal other than Pt, this reversal also occurs in the relationship between the wavelength-normalized film thickness of the dielectric film and the acoustic velocity. Equation 1 above indicates the relationship between the wavelength-normalized film thickness x of the IDT electrode and the electrode density y of the IDT electrode, in which this reversal occurs. In the case of the IDT electrode being made of Pt, the value x in Equation 1 is approximately 1.8%.

In the acoustic wave device 1 shown in FIG. 1, the wavelength-normalized film thickness x of the IDT electrode 3 is set at a value not less than x that satisfies Equation 1. Accordingly, in the acoustic wave device 1, the larger the film thickness of the dielectric film 13, the higher the acoustic velocity. In the first preferred embodiment, the film thicknesses of the dielectric film 13 in the first and second edge regions X1 and X2 are smaller than that of the dielectric film 13 in the central region M. Accordingly, the acoustic velocities in the first and second edge regions X1 and X2 are lower than the acoustic velocity in the central region M. Thus, even in the case in which a Love wave is excited and the IDT electrode 3 is thick, the acoustic velocities in the first and second edge regions X1 and X2 can be lowered reliably.

In the first preferred embodiment, the first and second edge regions X1 and X2 are low-velocity regions in which the acoustic velocities are lower than that of the central region M. On the other hand, as shown in FIG. 2, the first gap region C1 and the second gap region C2 include only one of the first electrode fingers 6 and the second electrode fingers 7, respectively. Accordingly, the first gap region C1 and the second gap region C2 are provided as high-velocity regions in which the acoustic velocities are higher than that of the central region M.

In the acoustic wave device 1, the low-velocity region is provided outside the central region M in the second direction, and the high-velocity region is provided outside the low-velocity region. Accordingly, a piston mode is able to be utilized, which can significantly reduce or prevent the transverse-mode ripple.

The following examples are the IDT electrodes 3 that are made of Mo, Au, W, Ta, or Cu, which are metals other than Pt.

Figure 4:
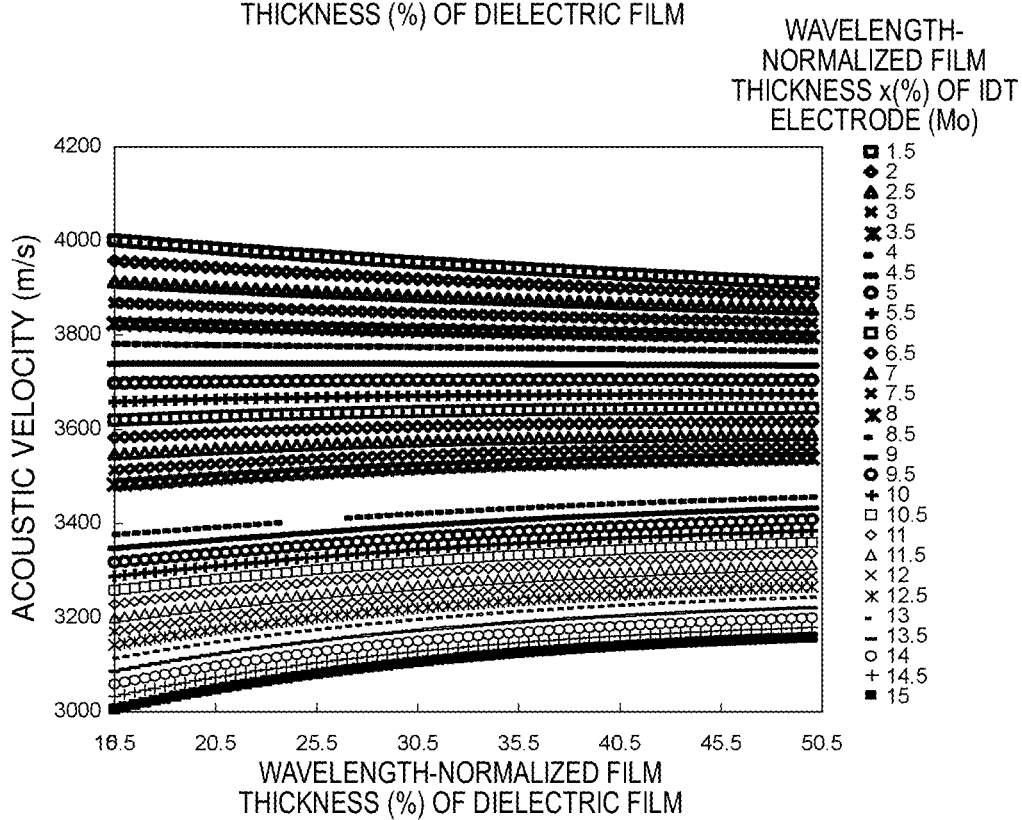
FIG. 4 is a view showing a relationship of the wavelength-normalized film thickness of the dielectric film, the acoustic velocity of the acoustic wave, and the wavelength-normalized film thickness of the IDT electrode in a case of the IDT electrode being made of Mo.
Figure 5:
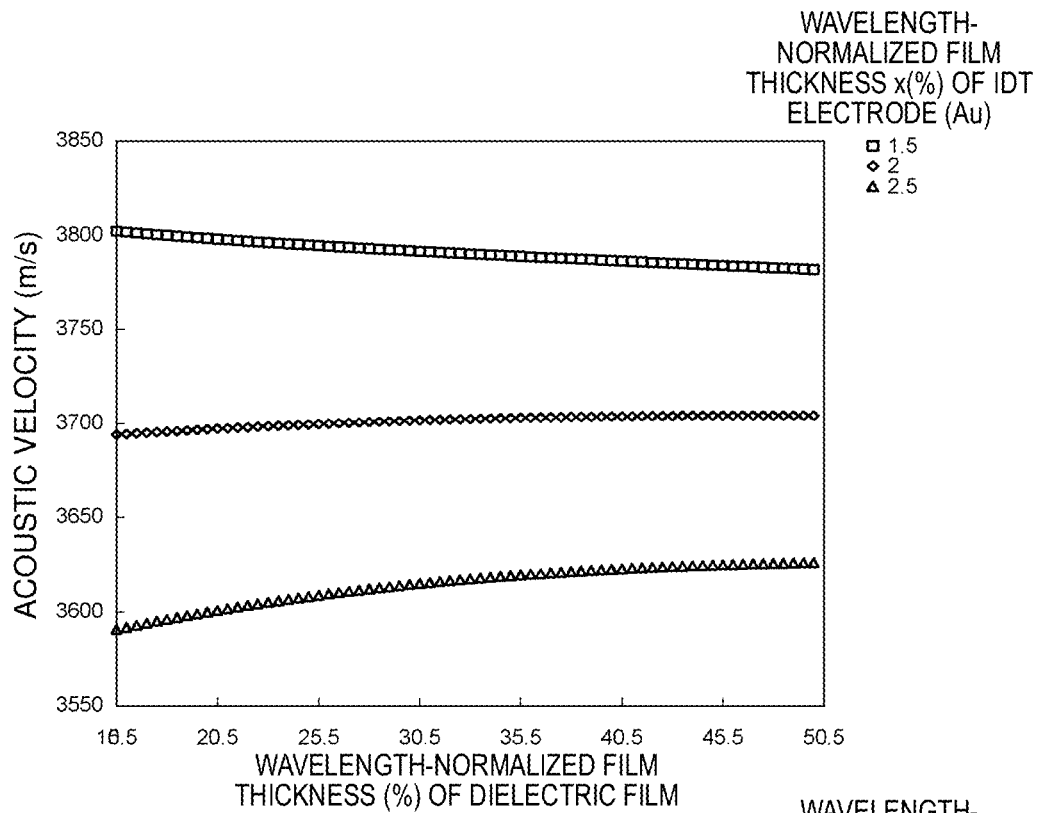
FIG. 5 is a view showing a relationship of the wavelength-normalized film thickness of the dielectric film, the acoustic velocity of the acoustic wave, and the wavelength-normalized film thickness of the IDT electrode in a case of the IDT electrode being made of Au.
Figure 6:
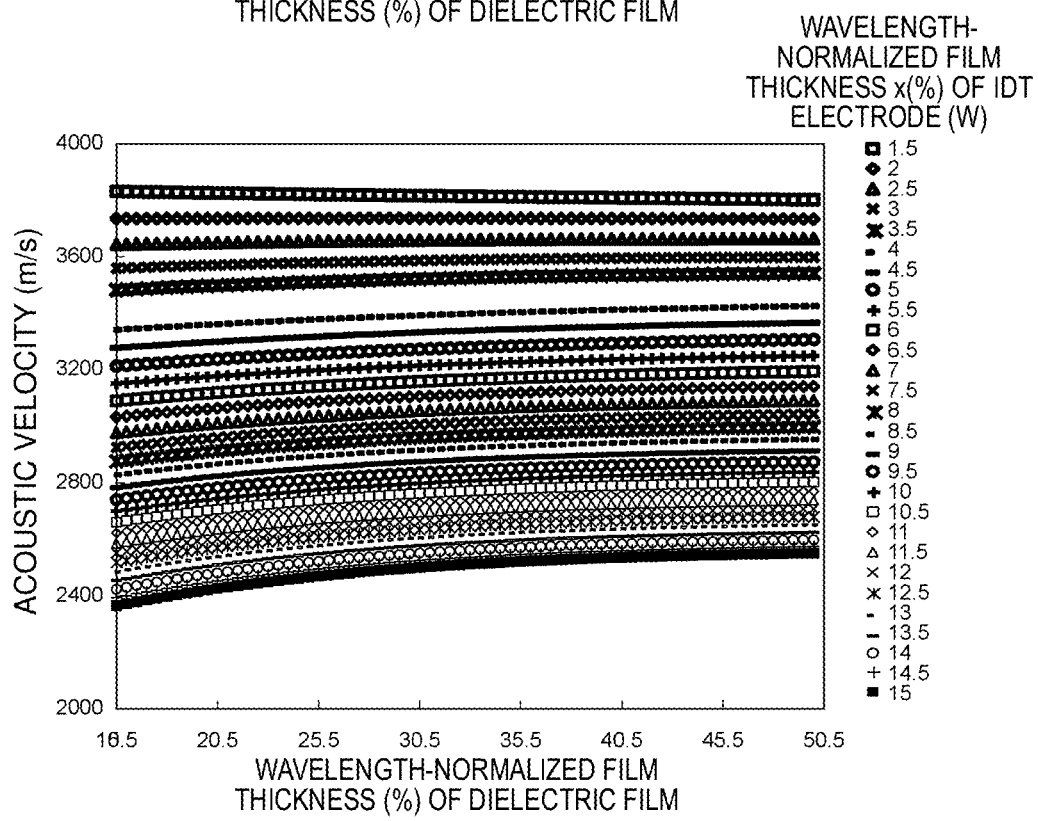
FIG. 6 is a view showing a relationship of the wavelength-normalized film thickness of the dielectric film, the acoustic velocity of the acoustic wave, and the wavelength-normalized film thickness of the IDT electrode in a case of the IDT electrode being made of W.
Figure 7:
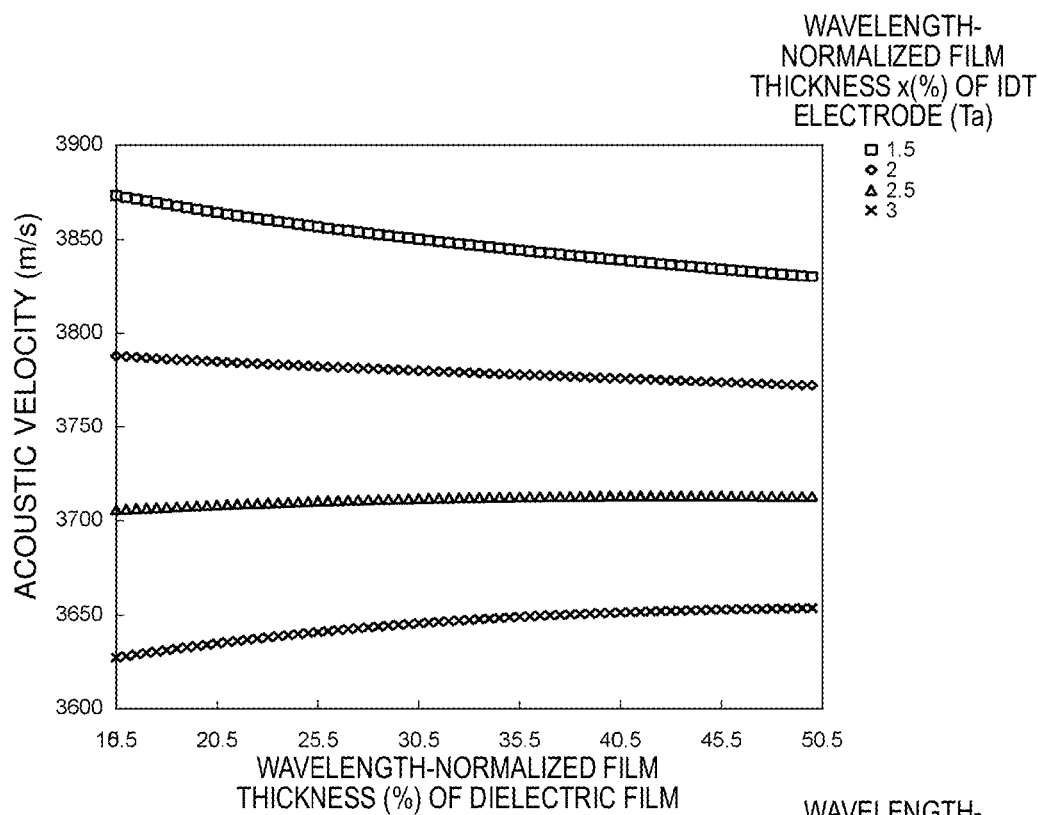
FIG. 7 is a view showing a relationship of the wavelength-normalized film thickness of the dielectric film, the acoustic velocity of the acoustic wave, and the wavelength-normalized film thickness of the IDT electrode in a case of the IDT electrode being made of Ta.
Figure 8:
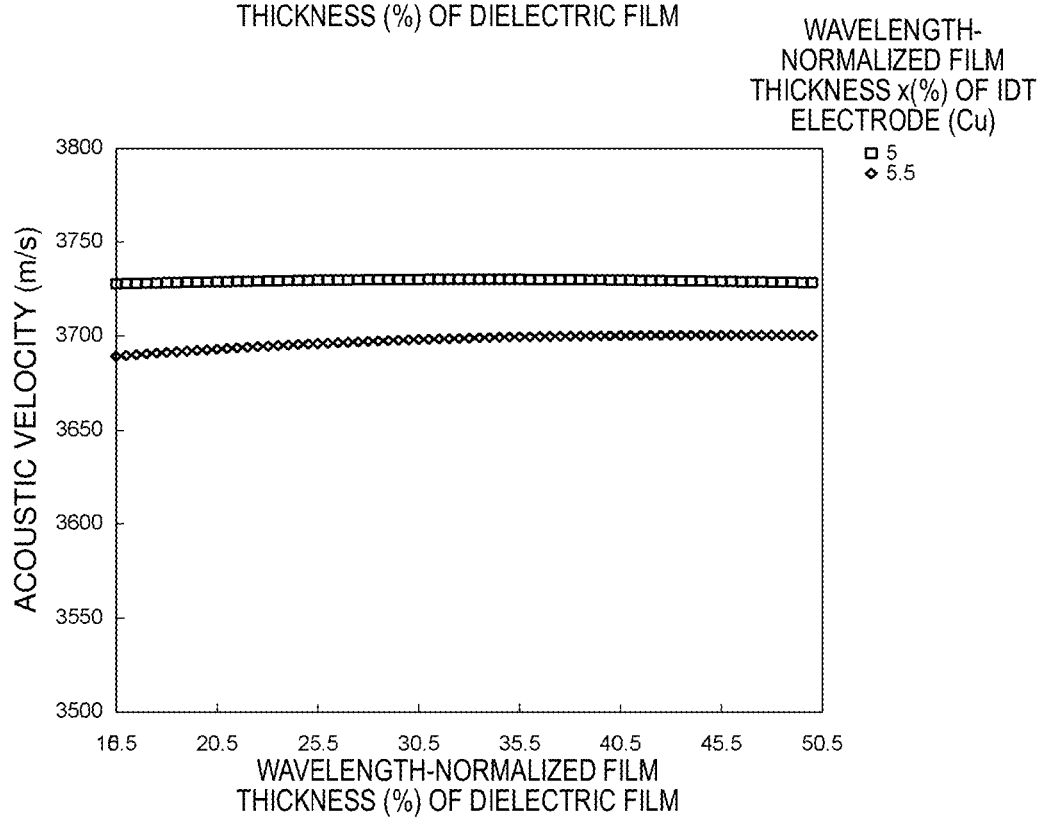
FIG. 8 is a view showing a relationship of the wavelength-normalized film thickness of the dielectric film, the acoustic velocity of the acoustic wave, and the wavelength-normalized film thickness of the IDT electrode in a case of the IDT electrode being made of Cu.

FIG. 4 is a view showing a relationship of the wavelength-normalized film thickness of the dielectric film, the acoustic velocity of the acoustic wave, and the wavelength-normalized film thickness of the IDT electrode in a case of the IDT electrode being made of Mo. FIG. 5 is a view showing a relationship of the wavelength-normalized film thickness of the dielectric film, the acoustic velocity of the acoustic wave, and the wavelength-normalized film thickness of the IDT electrode in a case of the IDT electrode being made of Au. FIG. 6 is a view showing a relationship of the wavelength-normalized film thickness of the dielectric film, the acoustic velocity of the acoustic wave, and the wavelength-normalized film thickness of the IDT electrode in a case of the IDT electrode being made of W. FIG. 7 is a view showing a relationship of the wavelength-normalized film thickness of the dielectric film, the acoustic velocity of the acoustic wave, and the wavelength-normalized film thickness of the IDT electrode in a case of the IDT electrode being made of Ta. FIG. 8 is a view showing a relationship of the wavelength-normalized film thickness of the dielectric film, the acoustic velocity of the acoustic wave, and the wavelength-normalized film thickness of the IDT electrode in a case of the IDT electrode being made of Cu.

In the case of the IDT electrode being made of Mo, when the wavelength-normalized film thickness x of the IDT electrode is about 5.05% or more, the wavelength-normalized film thickness x becomes not less than x that satisfies Equation 1. As is apparent from FIG. 4, when the wavelength-normalized film thickness x of the IDT electrode is about 5.05% or more, the acoustic velocity increases as the wavelength-normalized film thickness of the dielectric film increases. In the case of the IDT electrode being made of Au, it can be seen from FIG. 5 that when the wavelength-normalized film thickness x of the IDT electrode is about 1.9% or more, the acoustic velocity increases as the wavelength-normalized film thickness of the dielectric film increases. In the case of the IDT electrode being made of W, it can be seen from FIG. 6 that when the wavelength-normalized film thickness x of the IDT electrode is about 2.2% or more, the acoustic velocity increases as the wavelength-normalized film thickness of the dielectric film increases. In the case of the IDT electrode being made of Ta, it can be seen from FIG. 7 that when the wavelength-normalized film thickness x of the IDT electrode is about 2.55% or more, the acoustic velocity increases as the wavelength-normalized film thickness of the dielectric film increases. In the case of the IDT electrode being made of Cu, it can be seen from FIG. 8 that when the wavelength-normalized film thickness x of the IDT electrode is about 5.25% or more, the acoustic velocity increases as the wavelength-normalized film thickness of the dielectric film increases.

Referring to Table 2 below, in the case of the IDT electrode being made of Pt, W, Mo, Ta, Au, or Cu, it is appropriate to set x to be not less than a corresponding value listed in Table 2 depending on the electrode material.

TABLE 2

| Material | x = h/λ × 100 (%) |
| --- | --- |
| Pt | ≥1.8 |
| W | ≥2.2 |
| Mo | ≥5.05 |
| Ta | ≥2.55 |
| Au | ≥1.9 |
| Cu | ≥5.25 |

The wavelength-normalized film thickness of the IDT electrode is preferably, for example, about 25% or less. Accordingly, the IDT electrode is able to be easily manufactured.

Figure 9:
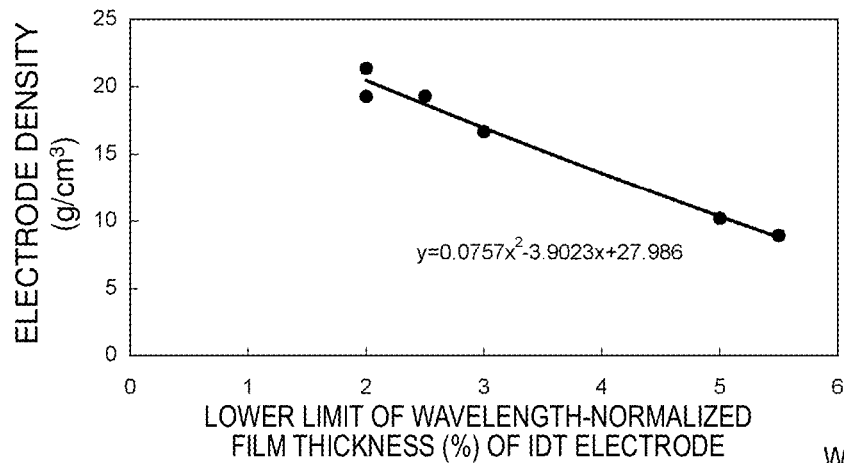
FIG. 9 is a view showing a relationship between the lower limit of wavelength-normalized film thickness of the IDT electrode and an electrode density of the IDT electrode, in which the acoustic velocity increases as the film thickness of the dielectric film increases.

FIG. 9 is a view showing a relationship between the lower limit of wavelength-normalized film thickness of the IDT electrode and an electrode density of the IDT electrode, in which the acoustic velocity increases as the film thickness of the dielectric film increases.

The curve shown in FIG. 9 is that of Equation 1. If an IDT electrode with a certain electrode density is predetermined, when the wavelength-normalized film thickness x of the IDT electrode is on or above the curve of the wavelength-normalized film thickness x in FIG. 9, the acoustic velocities in the first and second edge regions can be reliably lowered by adjusting the film thickness of the dielectric film. Thus, as described above, the transverse-mode ripple can be effectively significantly reduced or prevented by utilizing the piston mode.

The IDT electrode may include a multilayer metal film in which multiple metal films are laminated. Examples in which the IDT electrodes include multilayer metal films are described below.

Figure 10:
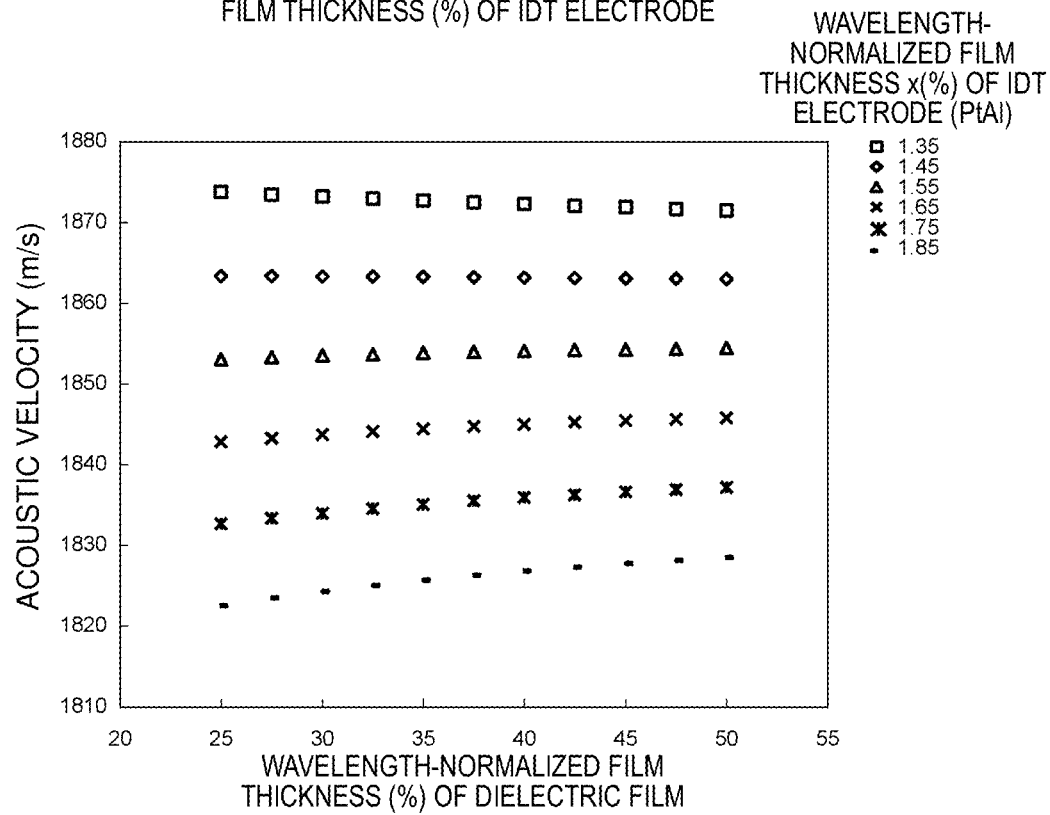
FIG. 10 is a view showing a relationship of the wavelength-normalized film thickness of the dielectric film, the acoustic velocity of the acoustic wave, and the wavelength-normalized film thickness of the IDT electrode in a case of the IDT electrode including a multilayer metal film in which a Pt film and an Al film are laminated.
Figure 11:
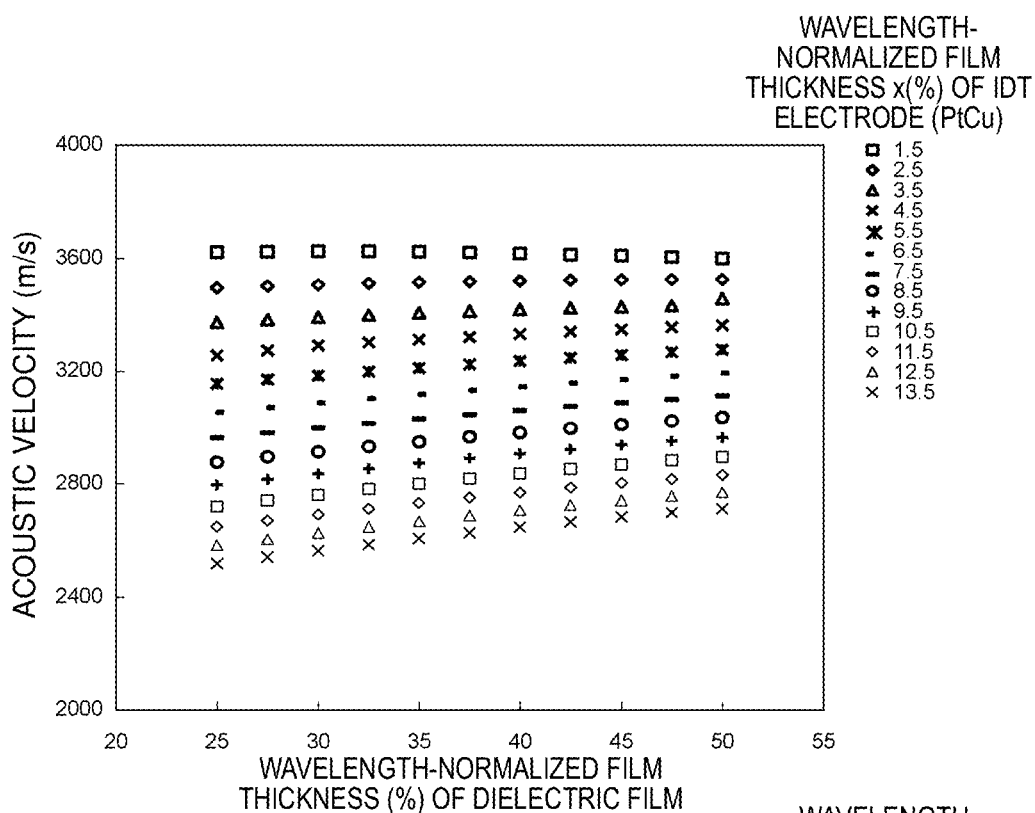
FIG. 11 is a view showing a relationship of the wavelength-normalized film thickness of the dielectric film, the acoustic velocity of the acoustic wave, and the wavelength-normalized film thickness of the IDT electrode in a case of the IDT electrode including a multilayer metal film in which a Pt film and an Cu film are laminated.
Figure 12:
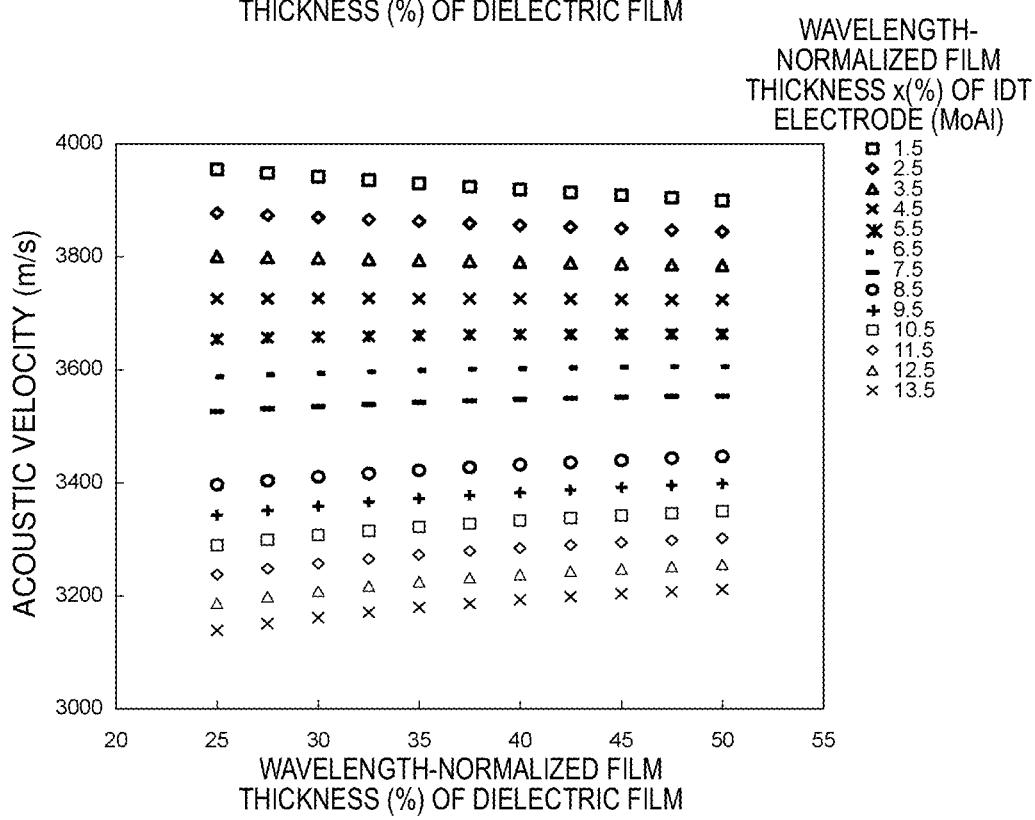
FIG. 12 is a view showing a relationship of the wavelength-normalized film thickness of the dielectric film, the acoustic velocity of the acoustic wave, and the wavelength-normalized film thickness of the IDT electrode in a case of the IDT electrode including a multilayer metal film in which a Mo film and an Al film are laminated.

FIG. 10 is a view showing a relationship of the wavelength-normalized film thickness of the dielectric film, the acoustic velocity of the acoustic wave, and the wavelength-normalized film thickness of the IDT electrode in a case of the IDT electrode including a multilayer metal film in which a Pt film and an Al film are laminated. FIG. 11 is a view showing a relationship of the wavelength-normalized film thickness of the dielectric film, the acoustic velocity of the acoustic wave, and the wavelength-normalized film thickness of the IDT electrode in a case of the IDT electrode including a multilayer metal film in which a Pt film and a Cu film are laminated. FIG. 12 is a view showing a relationship of the wavelength-normalized film thickness of the dielectric film, the acoustic velocity of the acoustic wave, and the wavelength-normalized film thickness of the IDT electrode in a case of the IDT electrode including a multilayer metal film in which a Mo film and an Al film are laminated.

As is apparent from FIG. 10, in the case of the IDT electrode including a multilayer metal film including the Pt and Al films, when the wavelength-normalized film thickness x of the IDT electrode is about 1.55% or more, the acoustic velocity increases as the film thickness of the dielectric film increases. As is apparent from FIG. 11, in the case of the IDT electrode including a multilayer metal film including the Pt and Cu films, when the wavelength-normalized film thickness x of the IDT electrode is about 2.5% or more, the acoustic velocity increases as the film thickness of the dielectric film increases. As shown in FIG. 12, in the case of the IDT electrode including a multilayer metal film including the Mo and Al films, when the wavelength-normalized film thickness x of the IDT electrode is about 5.5% or more, the acoustic velocity increases as the film thickness of the dielectric film increases. Note that in the case of a multilayer metal film, the density of the entire multilayer metal film is calculated from the densities and film thicknesses of electrode materials that define the multilayer metal film. When the relationships shown in FIGS. 10 to 12 were investigated, the electrode densities of the IDT electrodes were about 12.1 g/cm³, about 15.2 g/cm³, and about 6.5 g/cm³, respectively.

In the case of the IDT electrode including the multilayer metal film, the acoustic velocities in the first and second edge regions can be reliably lowered by setting the wavelength-normalized film thickness x of the IDT electrode to be not less than x that satisfies Equation 1 and by adjusting the film thickness of the dielectric film. As described above, the features described herein are able to be preferably applied, for example, to the case in which the Al film or the Cu film having a low electric resistance is laminated on the Pt film or the case in which the Al film having a low electric resistance is laminated on the Mo film.

The multilayer metal films shown in FIGS. 10, 11, and 12 are merely examples. In other words, the multilayer metal film may be defined by metals other than the above. Note that even in the case of multilayer metal films being made of the same metal species, the density of each multilayer metal film may become different depending on the ratio of film thickness. The lower limit of wavelength-normalized film thickness x of the IDT electrode can be determined based on the densities of the multilayer metal films.

Figure 13:
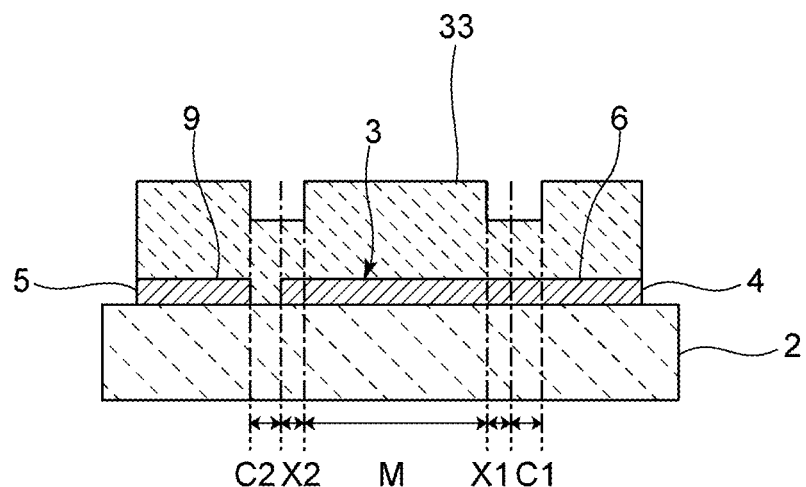
FIG. 13 is a cross-sectional view showing an acoustic wave device according to a modified example of the first preferred embodiment of the present invention, which corresponds to the cross-section showing in FIG. 1.

FIG. 13 is a cross-sectional view showing an acoustic wave device according to a modified example of the first preferred embodiment, which corresponds to the cross-section shown in FIG. 1.

In the present modified example, the film thickness of a dielectric film 33 in a region in which the first dummy electrode fingers and the first busbar 4 are provided is larger than that of the dielectric film 33 in the first edge region X1 and is the same or substantially the same as that of the dielectric film 33 in the central region M. Similarly, the film thickness of the dielectric film 33 in a region in which the second dummy electrode fingers 9 and the second busbar 5 are provided is larger than that of the dielectric film 33 in the second edge region X2 and is the same or substantially the same as that of the dielectric film in the central region M. This may simplify the manufacturing process.

Note that the film thickness of the dielectric film 33 in the region in which the first dummy electrode fingers and the first busbar 4 are provided may be different from the film thickness in the central region M, and the film thickness of the dielectric film 33 in the region in which the second dummy electrode fingers 9 and the second busbar 5 are provided may be different from the film thickness in the central region M.

Figure 14:
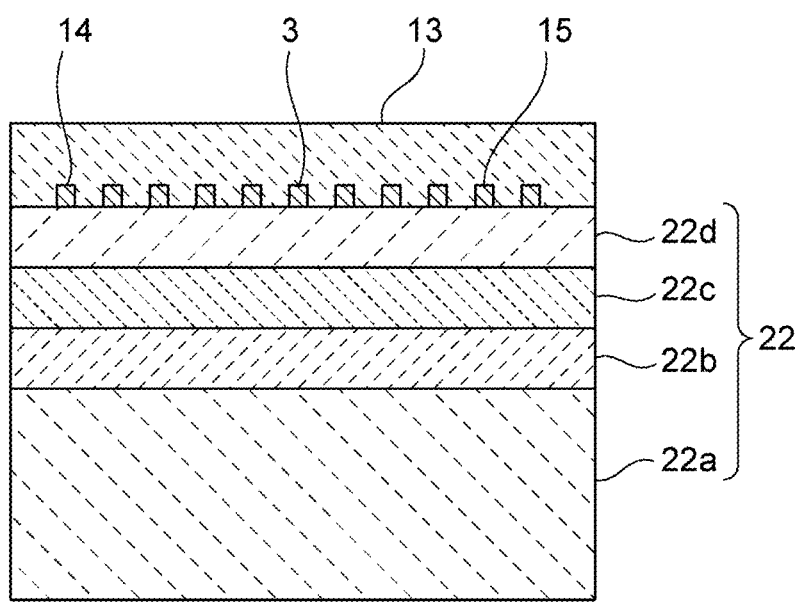
FIG. 14 is a cross-sectional front view showing an acoustic wave device according to a second preferred embodiment of the present invention.

FIG. 14 is a cross-sectional front view showing an acoustic wave device according to a second preferred embodiment of the present invention.

The second preferred embodiment is different from the first preferred embodiment in that a piezoelectric substrate 22 is provided as a multilayer substrate. Except for this point, the acoustic wave device of the second preferred embodiment is similar to the acoustic wave device 1 of the first preferred embodiment.

The piezoelectric substrate 22 has a structure in which a high-velocity layer 22b, a low-velocity layer 22c, and a piezoelectric layer 22d are laminated in this order on a support substrate 22a.

The piezoelectric layer 22d is preferably made of, for example, $LiTaO_3$. Also in this case, the reverse-velocity surface of the piezoelectric substrate 22 becomes elliptic provided that the high-velocity layer 22b is laminated directly or indirectly on the piezoelectric layer 22d.

The high-velocity layer 22b is made of a material in which a bulk wave propagates faster than the acoustic wave propagating in the piezoelectric layer 22d. The high-velocity layer 22b is preferably made of, for example, a material of which a main ingredient is aluminum nitride, aluminum oxide, silicon carbide, silicon oxynitride, silicon, DLC film, or diamond. Note that the material of the high-velocity layer 22b may be a relatively high-velocity material.

The low-velocity layer 22c is made of a material in which a bulk wave propagates slower than that a bulk wave propagating in the piezoelectric layer 22d. The low-velocity layer 22c is preferably made of, for example, a material of which a main ingredient is a compound of a glass, silicon oxynitride, tantalum oxide, or silicon oxide with fluorine, carbon, and boron being added therein. Note that the material of the low-velocity layer 22c may be a relatively low-velocity material. In the second preferred embodiment, the low-velocity layer 22c is laminated between the piezoelectric layer 22d and the high-velocity layer 22b. However, the piezoelectric substrate 22 does not necessarily include the low-velocity layer 22c.

The support substrate 22a is made of an appropriate material, for example, silicon or alumina. Note that the support substrate 22a may be a high-velocity substrate including a relatively high-velocity material described above. In this case, the support substrate 22a defines and functions as the high-velocity layer, and accordingly, the piezoelectric substrate 22 does not necessarily have the high-velocity layer 22b.

In the second preferred embodiment, components disposed above the piezoelectric layer 22d are provided similarly to those of the first preferred embodiment. Thus, even in the case in which a Love wave is excited and the IDT electrode 3 is thick, the acoustic velocities in the first and second edge regions can be lowered reliably. Moreover, a transverse-mode ripple can be significantly reduced or prevented effectively by utilizing the piston mode.

In the first and second preferred embodiments, the acoustic wave device has been described as a one-port surface acoustic wave resonator by way of example. However, the acoustic wave device is not limited to this and may be, for example, a longitudinally coupled resonator acoustic wave filter or a ladder filter that includes the acoustic wave resonator.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate including a piezoelectric layer with a reverse-velocity surface having an ellipse shape;
an IDT electrode on the piezoelectric substrate; and
a dielectric film on the piezoelectric substrate and covering the IDT electrode; wherein
a Love wave is excited;
the IDT electrode includes a first busbar and a second busbar opposite to each other, first electrode fingers of which respective first ends are connected to the first busbar, and second electrode fingers of which respective first ends are connected to the second busbar and that are interdigitated with the first electrode fingers;

when a first direction denotes a propagation direction of an acoustic wave and a second direction denotes a direction orthogonally or substantially orthogonally intersecting the first direction, the IDT electrode further includes an intersecting region in which the first electrode fingers and the second electrode fingers overlap each other as viewed in the first direction;

the intersecting region includes a central region at a central portion of the intersecting region in the second direction, a first edge region adjacent to or in a vicinity of the central region at a position near the first busbar, and a second edge region adjacent to or in a vicinity of the central region at a position near the second busbar;

when λ denotes a wavelength defined by a pitch of the first and second electrode fingers of the IDT electrode, h denotes a film thickness of the IDT electrode, x (%) denotes a wavelength-normalized film thickness defined as h/λ×100(%), and y (g/cm³) denotes an electrode density of the IDT electrode, the wavelength-normalized film thickness x is set, depending on the electrode density y of the IDT electrode, at a value not less than x that satisfies the following equation:

$$y=0.0757x^2-3.9023x+27.986;\text{ and}$$

a film thickness of the dielectric film in the first edge region and a film thickness of the dielectric film in the second edge region are smaller than that of the dielectric film in the central region.

2. The acoustic wave device according to claim 1, wherein the IDT electrode includes a multilayer metal film in which multiple metal films are laminated; and
the electrode density y of the IDT electrode is a density of the multilayer metal film.

3. The acoustic wave device according to claim 2, wherein the multilayer metal film includes a Pt film and an Al film, a Pt film and a Cu film, or a Mo film and an Al film.

4. The acoustic wave device according to claim 1, wherein the IDT electrode further includes a first gap region that is adjacent to or in a vicinity of the first edge region at a position near the first busbar and in which only the first electrode fingers of the first and second electrode fingers are provided, and a second gap region that is adjacent to or in a vicinity of the second edge region at a position near the second busbar and in which only the second electrode fingers of the first and second electrode fingers are provided.

5. The acoustic wave device according to claim 4, wherein the IDT electrode further includes first dummy electrode fingers of which respective first ends are connected to the first busbar and that oppose corresponding ones of the second electrode fingers with the first gap region located therebetween, and second dummy electrode fingers of which respective first ends are connected to the second busbar and that oppose corresponding ones of the first electrode fingers with the second gap region located therebetween.

6. The acoustic wave device according to claim 1, wherein the piezoelectric layer is made of LiNbO₃.

7. The acoustic wave device according to claim 6, wherein an Euler angle of the piezoelectric layer is an Euler angle of (φ, a range of −90°±30°, ψ).

8. The acoustic wave device according to claim 1, wherein the piezoelectric substrate includes a high-velocity layer which is laminated directly or indirectly on the piezoelectric layer and in which a bulk wave propagates faster than an acoustic wave propagating in the piezoelectric layer.

9. The acoustic wave device according to claim 8, wherein the piezoelectric substrate includes a low-velocity layer which is laminated between the piezoelectric layer and the high-velocity layer and in which a bulk wave propagates slower than a bulk wave propagating in the piezoelectric layer.

10. The acoustic wave device according to claim 1, wherein the acoustic wave device defines a one-port surface acoustic wave resonator.

11. The acoustic wave device according to claim 1, wherein the dielectric film is made of silicon oxide.

12. An acoustic wave device comprising:
a piezoelectric substrate including a piezoelectric layer with a reverse-velocity surface having an ellipse shape;
an IDT electrode on the piezoelectric substrate; and
a dielectric film on the piezoelectric substrate and covering the IDT electrode; wherein
a Love wave is excited;
the IDT electrode includes a first busbar and a second busbar opposite to each other, first electrode fingers of which respective first ends are connected to the first busbar, and second electrode fingers of which respective first ends are connected to the second busbar and that are interdigitated with the first electrode fingers;
when a first direction denotes a propagation direction of an acoustic wave and a second direction denotes a direction orthogonally or substantially orthogonally intersecting the first direction, the IDT electrode further includes an intersecting region in which the first electrode fingers and the second electrode fingers overlap each other as viewed in the first direction;
the intersecting region includes a central region located at a central portion of the intersecting region in the second direction, a first edge region adjacent to or in a vicinity of the central region at a position near the first busbar, and a second edge region adjacent to or in a vicinity of the central region at a position near the second busbar;
the IDT electrode is made of at least one of Pt, Au, W, Ta, Mo, and Cu;
when λ denotes a wavelength defined by a pitch of the first and second electrode fingers of the IDT electrode, h denotes a film thickness of the IDT electrode, x (%) denotes a wavelength-normalized film thickness defined as h/λ×100(%), the wavelength-normalized film thickness x is set, depending on a material of the IDT electrode, at a value not less than a corresponding value in Table 1 below:

TABLE 1

| Material | x = h/λ × 100 (%) |
|---|---|
| Pt | ≥1.8 |
| W | ≥2.2 |
| Mo | ≥5.05 |
| Ta | ≥2.55 |
| Au | ≥1.9 |
| Cu | ≥5.25; | and
a film thickness of the dielectric film in the first edge region and a film thickness of the dielectric film in the second edge region are smaller than that of the dielectric film in the central region.

13. The acoustic wave device according to claim 12, wherein the IDT electrode further includes a first gap region that is adjacent to or in a vicinity of the first edge region at a position near the first busbar and in which only the first electrode fingers of the first and second electrode fingers are provided, and a second gap region that is adjacent to or in a vicinity of the second edge region at a position near the second busbar and in which only the second electrode fingers of the first and second electrode fingers are provided.

14. The acoustic wave device according to claim 13, wherein the IDT electrode further includes first dummy electrode fingers of which respective first ends are connected to the first busbar and that oppose corresponding ones of the second electrode fingers with the first gap region located therebetween, and second dummy electrode fingers of which respective first ends are connected to the second busbar and that oppose corresponding ones of the first electrode fingers with the second gap region located therebetween.

15. The acoustic wave device according to claim 12, wherein the piezoelectric layer is made of $LiNbO_3$.

16. The acoustic wave device according to claim 15, wherein an Euler angle of the piezoelectric layer is an Euler angle of ($\varphi$, a range of $-90°\pm30°$, $\psi$).

17. The acoustic wave device according to claim 12, wherein the piezoelectric substrate includes a high-velocity layer which is laminated directly or indirectly on the piezoelectric layer and in which a bulk wave propagates faster than an acoustic wave propagating in the piezoelectric layer.

18. The acoustic wave device according to claim 17, wherein the piezoelectric substrate includes a low-velocity layer which is laminated between the piezoelectric layer and the high-velocity layer and in which a bulk wave propagates slower than a bulk wave propagating in the piezoelectric layer.

19. The acoustic wave device according to claim 12, wherein the acoustic wave device defines a one-port surface acoustic wave resonator.

20. The acoustic wave device according to claim 12, wherein the dielectric film is made of silicon oxide.

* * * * *